(12) United States Patent
Koga et al.

(10) Patent No.: US 12,485,649 B2
(45) Date of Patent: Dec. 2, 2025

(54) ELECTROMAGNETIC SHIELDING CONDUCTIVE SHEET WITH METALLIC PLATE

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Nobunori Koga, Yokkaichi (JP); Dohyung Kim, Yokkaichi (JP); Daisuke Hashimoto, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 604 days.

(21) Appl. No.: 17/917,208

(22) PCT Filed: Mar. 19, 2021

(86) PCT No.: PCT/JP2021/011372
§ 371 (c)(1),
(2) Date: Oct. 5, 2022

(87) PCT Pub. No.: WO2021/215159
PCT Pub. Date: Oct. 28, 2021

(65) Prior Publication Data
US 2023/0182442 A1    Jun. 15, 2023

(30) Foreign Application Priority Data

Apr. 22, 2020    (JP) .................................. 2020-076056

(51) Int. Cl.
*B32B 15/01* (2006.01)
*B23K 31/02* (2006.01)
(Continued)

(52) U.S. Cl.
CPC .............. *B32B 15/01* (2013.01); *B23K 31/02* (2013.01); *B23K 35/0238* (2013.01); *B23P 11/005* (2013.01); *B23K 2101/38* (2018.08)

(58) Field of Classification Search
CPC .... B32B 15/01; B23K 31/02; B23K 35/0238; B23K 2101/38; B23P 11/005; F16B 5/12; H05K 9/00
See application file for complete search history.

(56) References Cited

U.S. PATENT DOCUMENTS

| | | | | |
|---|---|---|---|---|
| 5,529,502 | A * | 6/1996 | Peltier ..................... | H01R 12/79 439/493 |
| 8,379,408 | B2 * | 2/2013 | Hankui ................ | H05K 9/0032 361/818 |

(Continued)

FOREIGN PATENT DOCUMENTS

| JP | 2009-104875 A | 5/2009 |
|---|---|---|
| JP | 2014-022143 A | 2/2014 |

(Continued)

OTHER PUBLICATIONS

Jun. 1, 2021 International Search Report issued in International Patent Application No. PCT/JP2021/011372.

*Primary Examiner* — Jeffrey T Carley
*Assistant Examiner* — Jose K Abraham
(74) *Attorney, Agent, or Firm* — Oliff PLC

(57) ABSTRACT

A conductive assembly including: a conductive sheet; a metallic plate; and a sheet fixing plate separate from the metallic plate, wherein: a portion of the conductive sheet is sandwiched between the metallic plate and the sheet fixing (Continued)

plate, the sheet fixing plate is overlapped with and fixed to the metallic plate, and a positioning recess is formed in one of the metallic plate and the sheet fixing plate, and a positioning protrusion is formed in the other so as to be positioned in contact with an edge of the positioning recess.

6 Claims, 3 Drawing Sheets

(51) Int. Cl.
*B23K 35/02* (2006.01)
*B23K 101/38* (2006.01)
*B23P 11/00* (2006.01)

(56) References Cited

U.S. PATENT DOCUMENTS

| | | | |
|---|---|---|---|
| 2007/0211445 A1* | 9/2007 | Robinson | H01L 23/552 |
| | | | 361/818 |
| 2011/0186343 A1* | 8/2011 | Li | H05K 9/0032 |
| | | | 174/377 |
| 2011/0214916 A1* | 9/2011 | Chang | H05K 9/00 |
| | | | 174/382 |
| 2016/0190712 A1* | 6/2016 | Hirooka | H01R 13/65914 |
| | | | 174/84 C |
| 2016/0380390 A1* | 12/2016 | Kusamaki | H01R 9/2483 |
| | | | 439/607.44 |
| 2018/0082764 A1* | 3/2018 | Wakamori | H01B 13/0026 |
| 2018/0361516 A1* | 12/2018 | Kobayashi | B23K 11/185 |
| 2023/0182442 A1* | 6/2023 | Koga | F16B 5/12 |
| | | | 29/825 |

FOREIGN PATENT DOCUMENTS

| | | | | |
|---|---|---|---|---|
| JP | 2015005456 A | * | 1/2015 | |
| JP | 2015-057758 A | | 3/2015 | |
| JP | 2015056534 A | * | 3/2015 | |
| JP | 2017-022264 A | | 1/2017 | |
| JP | 2019-005768 A | | 1/2019 | |
| JP | 2021-002647 A | | 1/2021 | |

* cited by examiner

ELECTROMAGNETIC SHIELDING CONDUCTIVE SHEET WITH METALLIC PLATE

BACKGROUND

The present disclosure relates to a conductive sheet with a metallic plate. JP 2017-022264A discloses an electromagnetic shield member that includes a wiring electromagnetic shield part and a connection-part electromagnetic shield cover. The connection-part electromagnetic shield cover includes a cover body that covers a connection part at an end portion of a wiring member and a fixing section that extends from the cover body and is bended and deformed so as to be folded back to thereby sandwich and fix one end edge portion of the wiring electromagnetic shield part.

JP 2015-57758 A discloses that an edge portion of a conductive sheet material is sandwiched by a pair of plate-like sandwiching parts and that the pair of plate-like sandwiching parts are connected via a fold-back part.

SUMMARY

It is suggested that a conductive sheet be sandwiched by two separate metallic plates. In this case, it is desirable that the two members sandwiching the conductive sheet therebetween be easily positioned.

An exemplary aspect of the disclosure allows easy positioning of a metallic plate and a sheet fixing member sandwiching a conductive sheet therebetween.

A conductive assembly includes: a conductive sheet; a metallic plate; and a sheet fixing plate separate from the metallic plate, wherein: a portion of the conductive sheet is sandwiched between the metallic plate and the sheet fixing plate, the sheet fixing plate is overlapped with and fixed to the metallic plate, and a positioning recess is formed in one of the metallic plate and the sheet fixing plate, and a positioning protrusion is formed in the other so as to be positioned in contact with an edge of the positioning recess.

According to the present disclosure, the metallic plate and the sheet fixing plate sandwiching the conductive sheet therebetween can be easily positioned.

DETAILED DESCRIPTION OF EMBODIMENTS

Description of Embodiments of Present Disclosure

Figure 1:
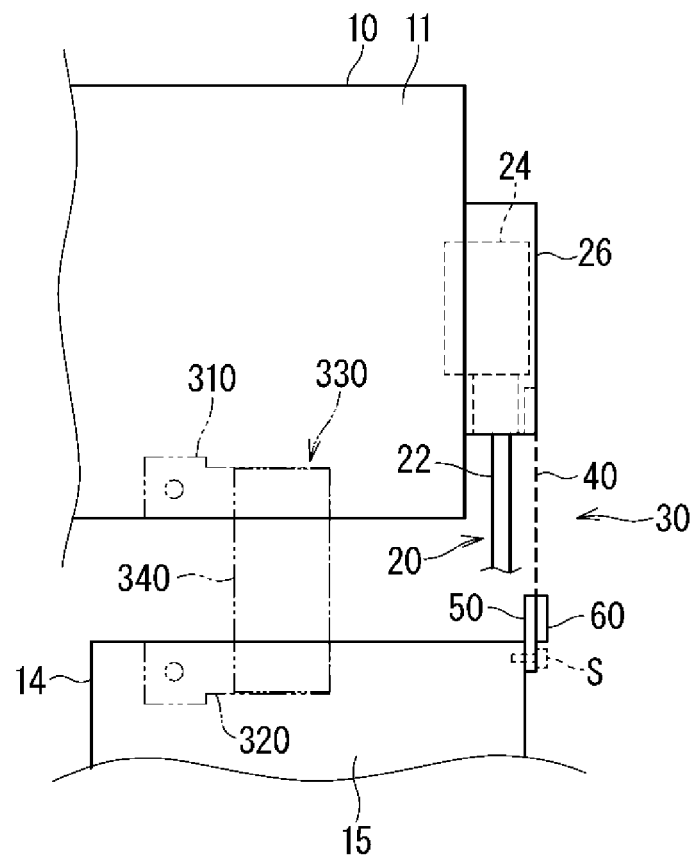
FIG. 1 is an explanatory diagram illustrating an example in which a conductive sheet with a metallic plate according to an embodiment is provided between two electric devices.

First, embodiments of the present disclosure will be listed and described.

A conductive sheet with a metallic plate of the present disclosure is as follows.

(1) A conductive sheet with a metallic plate includes: a conductive sheet; a metallic plate; and a sheet fixing member separate from the metallic plate, in which, with a portion of the conductive sheet sandwiched between the metallic plate and the sheet fixing member, the sheet fixing member is overlapped with and fixed to the metallic plate, a positioning recessed part is formed in one of the metallic plate and the sheet fixing member, and a positioning protruding part is formed in the other so as to be positioned in contact with an edge of the positioning recessed part. According to the present disclosure, with the positioning protruding part positioned in contact with the edge of the positioning recessed part, the sheet fixing member is overlapped with the metallic plate. Therefore, the metallic plate and the sheet fixing member sandwiching the conductive sheet therebetween can be easily positioned.

(2) In the conductive sheet with a metallic plate according to (1), the conductive sheet may be in contact with the positioning protruding part. Thus, the conductive sheet is also positioned with reference to the positioning protruding part.

(3) In the conductive sheet with a metallic plate according to (2), a window portion may be formed in the other of the metallic plate and the sheet fixing member at a position next to the positioning protruding part, the window portion enabling viewing of the edge of the conductive sheet in contact with the positioning protruding part. This makes it easy to check if the conductive sheet is inserted until the conductive sheet is in contact with the positioning protruding part.

(4) In the conductive sheet with a metallic plate according to any one of (1) to (3), the positioning recessed part may include a positioning hole part with a periphery that is entirely surrounded by an edge, and the positioning protruding part may be fitted in the positioning hole part. Since the positioning protruding part is fitted in the positioning hole part, the sheet fixing member can be more reliably positioned with respect to the metallic plate.

(5) In the conductive sheet with a metallic plate according to any one of (1) to (4), the positioning recessed part may include a positioning notch part that is partially surrounded by an edge, and the positioning protruding part may be in contact with the edge of the positioning notch part. This makes it easy to relatively move the positioning protruding part toward the positioning notch part while viewing the positioning protruding part, whereby the positioning protruding part can be easily positioned by the positioning notch part.

(6) In the conductive sheet with a metallic plate according to any one of (1) to (5), the positioning recessed part may be formed in the metallic plate, and the positioning protruding part may be formed in the sheet fixing member. Accordingly, even if the sheet fixing member has a shape whose front and back sides are difficult to determine, the front and back sides of the sheet fixing member can be easily determined using a protruding direction of the positioning protruding part as a clue.

(7) In the conductive sheet with a metallic plate according to any one of (1) to (6), the sheet fixing member may be a plate made of a metal, and the metallic plate and the sheet fixing member may be fixed to each other by a mechanical clinch part. Accordingly, the metallic plate and the sheet fixing member can be easily fixed to each other.

Details of Embodiments of the Present Disclosure

Specific examples of the conductive sheet with a metallic plate in the present disclosure will be described with reference to the drawings. It should be noted that the present disclosure is not limited to the examples herein, but rather is indicated by the scope of claims, and is intended to include all modifications within a meaning and scope equivalent to the scope of claims.

Embodiments

Hereinafter, the conductive sheet with a metallic plate according to an embodiment will be described. FIG. 1 is an explanatory diagram illustrating an example in which a conductive sheet with a metallic plate 30 (conductive assembly) is provided between two electric devices 10 and 14 (a first electric device 10 and a second electric device 14). The two electric devices 10 and 14 may be devices installed in a vehicle or the like, for example. A possible combination of the two electric devices 10 and 14 is a motor for driving an electric automobile and an inverter for driving the motor, or an inverter for motor driving and a battery supplying electric power to the inverter.

The first electric device 10 is structured such that electric components are stored in a casing 11. The second electric device 14 is also structured such that electric components are stored in a casing 15. The casings 11 and 15 are conductive casings formed of metallic conductive members or the like, for example.

A wiring member 20 is connected to at least one of the two electric devices 10 and 14. FIG. 1 illustrates a state in which one end portion of the wiring member 20 is connected to the first electric device 10. In the present embodiment, the wiring member 20 is a member for connecting the first electric device 10 to another electric device or the like. The other end portion of the wiring member 20 may be connected to the second electric device 14 or another electric device.

The wiring member 20 includes a transmission member 22 and a connection part 24.

The transmission member 22 is a member in which an insulating portion made of a resin or the like is formed on the periphery of at least one linear conductor. The transmission member 22 may be a member in which a plurality of coated electric wires are assembled. The transmission member may be structured such that a plurality of linear conductors are embedded in one insulating portion in a state of being insulated from each other.

The connection part 24 is provided at one end portion of the transmission member 22. The connection part 24 is a member that connects the linear conductor in the transmission member 22 to an electric component of the first electric device 10. The connection part 24 is a member including a terminal and a housing holding the terminal, for example. When the housing of the connection part 24 is attached to the casing 11 by a fitting structure, a screwing structure, or the like, the terminal held by the housing is kept in a state of being connected to the electric component in the first electric device 10.

The connection part 24 is covered with a metallic cover 26. The metallic cover 26 is a member that is formed by pressing a metallic plate of copper, copper alloy, aluminum, aluminum alloy, or the like. The metallic cover 26 is shaped so as to cover the connection part 24 except for an extended portion of the transmission member 22 on the surface of the casing 11. The metallic cover 26 is fixed to the casing 11 by screwing or the like. The metallic cover 26 plays the role of electromagnetically shielding the end portion of the transmission member 22 and the connection part 24.

The conductive sheet with a metallic plate 30 is an electromagnetic shield member that covers at least a portion of the wiring member 20. The conductive sheet with a metallic plate 30 here includes a conductive sheet 40, a metallic plate 50, and a sheet fixing member 60 (sheet fixing plate) separate from the metallic plate 50. The metallic plate 50 and the sheet fixing member 60 are fixed to one end portion of the conductive sheet 40. The metallic plate 50 is fixed to the casing 11 of the second electric device 14. The other end portion of the conductive sheet 40 is fixed to the metallic cover 26. Therefore, the conductive sheet 40 is supported at a specific position so as to stretch between the metallic cover 26 fixed to the first electric device 10 and the casing 15 of the second electric device 14.

The wiring member 20 extends in the same direction as the direction in which the conductive sheet 40 extends from the connection part 24, on the side nearer the casing 11 than the conductive sheet 40. Thus, at least the end portion on the first electric device 10 side of the wiring member 20 is covered with the conductive sheet 40. In this respect, the conductive sheet with a metallic plate 30 is an electromagnetic shield member that electromagnetically shields at least a portion of the wiring member 20.

Figure 2:
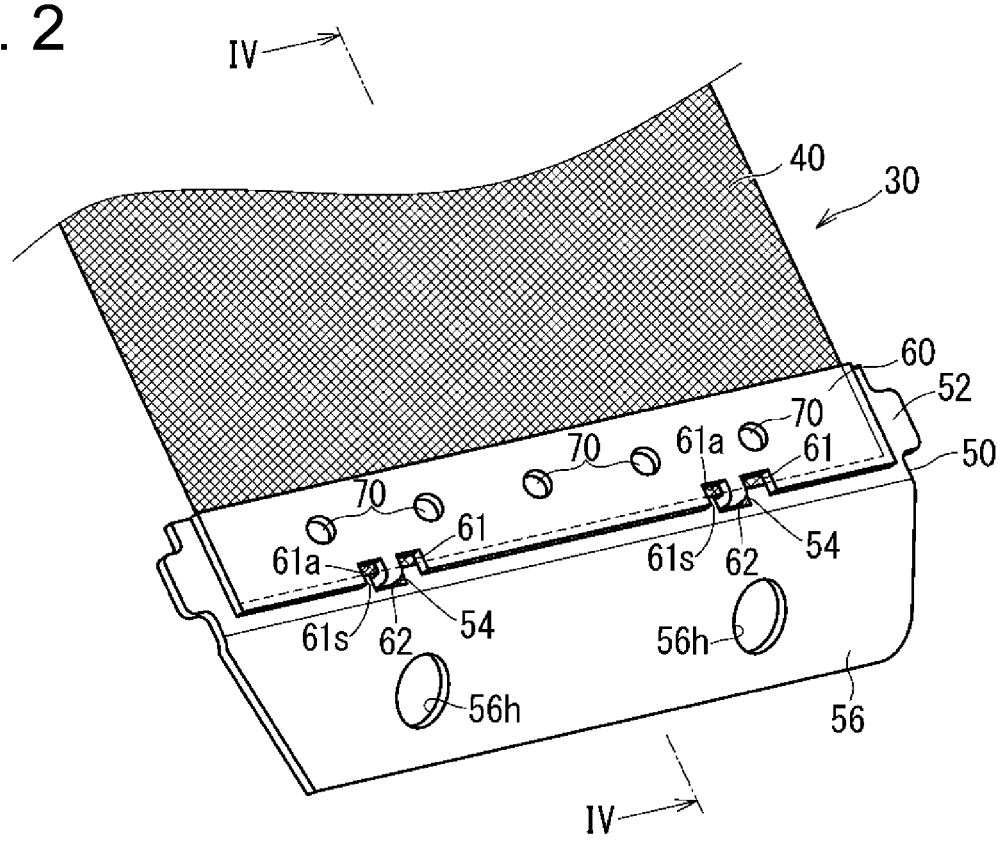
FIG. 2 is a perspective view of the conductive sheet with a metallic plate.
Figure 3:
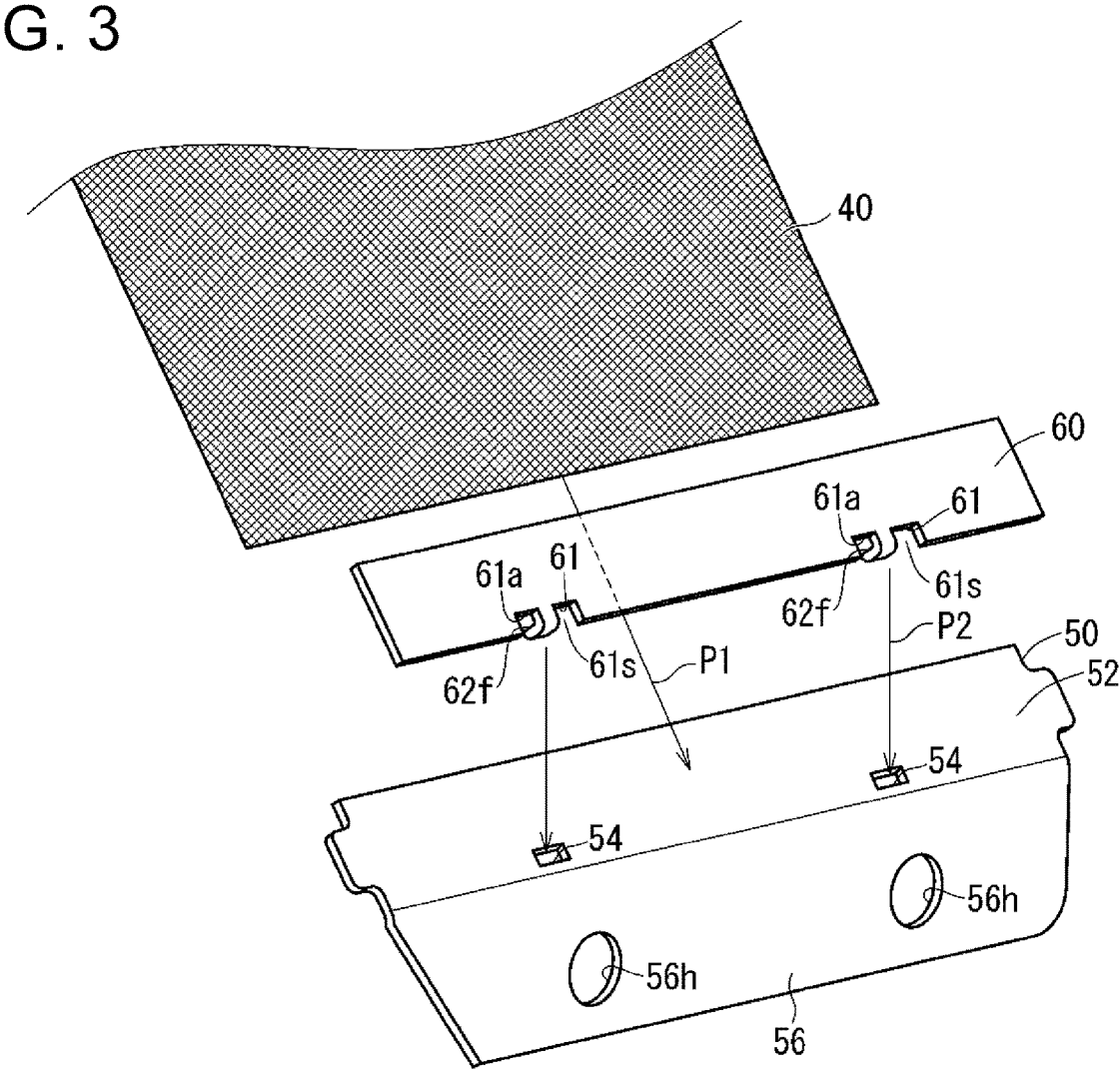
FIG. 3 is an exploded perspective view of the conductive sheet with a metallic plate.
Figure 4:
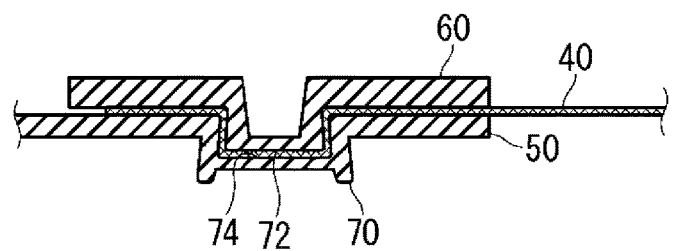
FIG. 4 is a cross-sectional view taken along line IV-IV in FIG. 2.

Hereinafter, a structure in which one end portion of the conductive sheet 40 is fixed to the metallic plate 50 and the sheet fixing member 60 will be mainly described. FIG. 2 is a perspective view of the conductive sheet with a metallic plate 30. FIG. 3 is an exploded perspective view of the conductive sheet with a metallic plate 30. FIG. 4 is a cross-sectional view taken along line IV-IV in FIG. 2.

The conductive sheet 40 is a sheet-shaped conductive member. The conductive sheet 40 is made of woven metallic wires, for example. The woven metallic wires constitute a metallic braid, metallic cloth, metallic net, or the like. The conductive sheet 40 is formed in a rectangular shape. The metallic plate 50 and the sheet fixing member 60 are fixed to one end portion of the conductive sheet 40. The conductive sheet 40 is long enough to be arranged over the first electric device 10 and the second electric device 14, for example. The conductive sheet 40 is wide enough to hide the transmission member 22 from the side opposite to the first electric device 10, for example.

The metallic plate 50 and the sheet fixing member 60 are members to keep the conductive sheet 40 in a state of covering a portion of the wiring member 20. The metallic plate 50 and the sheet fixing member 60 here keep the conductive sheet 40, together with the metallic cover 26, in a state of covering a portion of the wiring member 20.

The metallic plate 50 is a member that is formed by pressing a metallic plate of copper, copper alloy, aluminum, aluminum alloy, or the like. The metallic plate 50 includes a sandwiching and fixing body part 52 and a fixing section 56.

The sandwiching and fixing body part 52 is formed in a rectangular shape, more specifically, in an elongated rectangular shape. The longitudinal dimension of the sandwiching and fixing body part 52 is made equal to or larger than the width of the conductive sheet 40.

The fixing section 56 extends outward from the outer periphery of the sandwiching and fixing body part 52. In this example, the fixing section 56 extends outward from one long-side portion of the sandwiching and fixing body part 52. The direction of extension of the fixing section 56 is diverted from the direction of extension of the conductive sheet 40 from the sandwiching and fixing body part 52. In this example, the fixing section 56 extends in a direction opposite to the direction in which the conductive sheet 40 extends with respect to the sandwiching and fixing body part 52. The fixing section 56 is a part to be fixed to a fixing target part such as the casing 15. In the present embodiment, the fixing section 56 has screw insertion holes 56h. With screws S inserted into the screw insertion holes 56h, the screws S are screwed and tightened in thread grooves in the casing 15. Accordingly, the fixing section 56 is fixed to the casing 15. The fixing section 56 may be fixed to the casing 15 by another means, for example, welding, riveting, caulking, or the like.

The fixing section 56 is bent toward one main surface of the sandwiching and fixing body part 52 with respect to the sandwiching and fixing body part 52. Thus, the one main surface and the other main surface of the metallic plate 50 can be distinguished from each other using the direction in which the sandwiching and fixing body part 52 is bent as a reference. Alternatively, the fixing section 56 may extend without bending with respect to the sandwiching and fixing body part 52.

The sheet fixing member 60 is a member formed separately from the metallic plate 50. With one end portion of the conductive sheet 40 sandwiched between the metallic plate 50 and the sheet fixing member 60, the sheet fixing member 60 is overlapped with and fixed to the metallic plate 50.

The shape of the sheet fixing member 60 is not particularly limited as long as the sheet fixing member 60 is a member capable of being overlapped with the metallic plate 50. For example, the sheet fixing member 60 may have a plate shape or a rectangular-solid shape. The material for the sheet fixing member 60 is also not particularly limited. The sheet fixing member 60 may be made of a metal such as copper, copper alloy, aluminum, or aluminum alloy, or may be made of a resin.

In the present embodiment, the sheet fixing member 60 is made of a metallic plate of copper, copper alloy, aluminum, aluminum alloy, or the like. The sheet fixing member 60 here is formed in a rectangular plate shape, more specifically, in an elongated rectangular plate shape. The longitudinal dimension of the sheet fixing member 60 is made equal to or larger than the width of the conductive sheet 40. The sheet fixing member 60 may also have an integrally formed fixing section or the like for fixing to a fixing target part.

In the present embodiment, the longitudinal dimension of the sheet fixing member 60 is smaller than the longitudinal dimension of the sandwiching and fixing body part 52, and the short-side dimension of the sheet fixing member 60 is smaller than the short-side dimension of the sandwiching and fixing body part 52.

A positioning recessed part 54 (positioning recess) is formed in one of the metallic plate 50 and the sheet fixing member 60, and a positioning protruding part 62 (positioning protrusion) is formed in the other. In this example, the positioning recessed part 54 is formed in the metallic plate 50 and the positioning protruding part 62 is formed in the sheet fixing member 60.

More specifically, the positioning recessed part 54 is formed in the sandwiching and fixing body part 52 of the metallic plate 50 so as to be close to the fixing section 56. One or more positioning recessed parts 54 can be provided. In the present embodiment, a plurality of (two in this example) positioning recessed parts 54 are formed spaced apart from each other in the longitudinal direction of the sandwiching and fixing body part 52.

Figure 5:
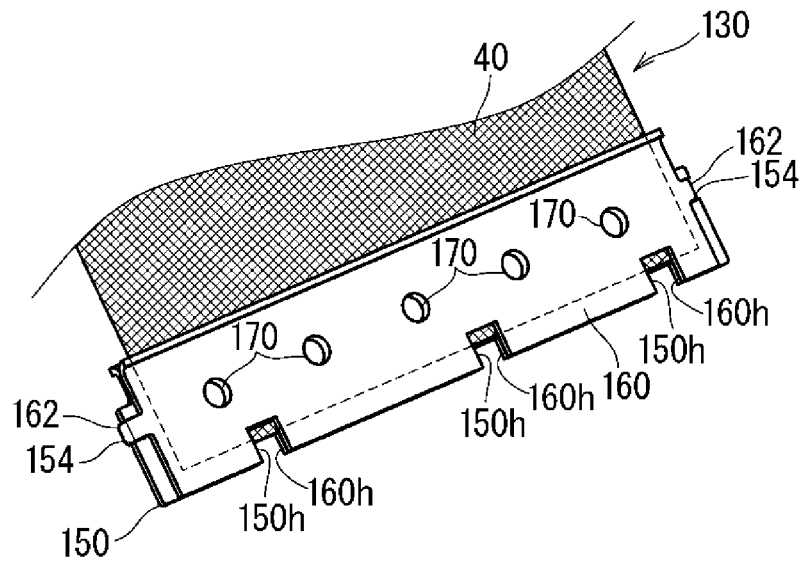
FIG. 5 is a perspective view of a conductive sheet with a metallic plate according to a first modified example.
Figure 6:
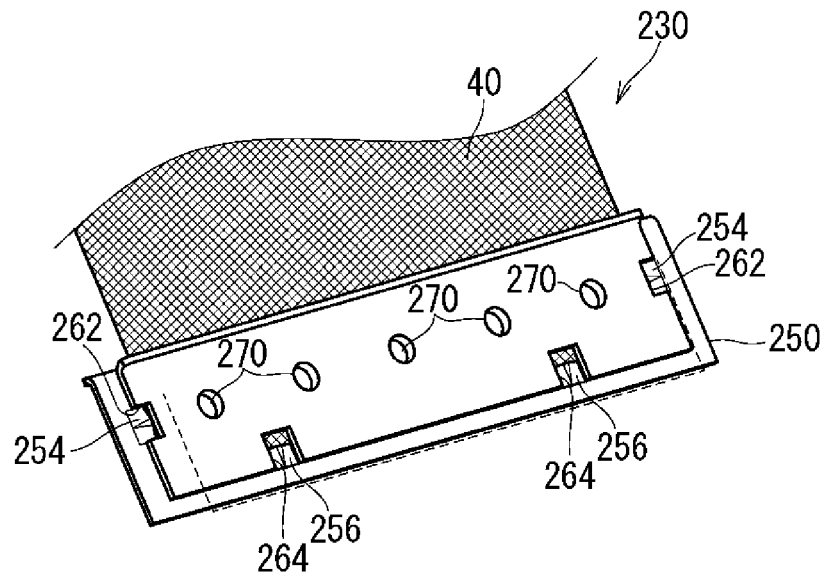
FIG. 6 is a perspective view of a conductive sheet with a metallic plate according to a second modified example.

The positioning recessed part 54 may be a recess that is capable of restricting the position of the positioning protruding part 62 in at least one direction by contact with the positioning protruding part 62. In this example, the positioning recessed part 54 is a positioning hole part (positioning hole) with a periphery that is entirely surrounded by an edge. The positioning recessed part 54 need not be a positioning hole part but may be a recessed part that is partially surrounded by an edge, the remaining portion thereof being open. Modified examples in this case are illustrated in FIG. 5 or FIG. 6. The positioning recessed part 54 that is the positioning hole part in the present embodiment is a hole penetrating through the metallic plate 50. However, the positioning recessed part 54 that is a positioning hole part is not necessarily required to penetrate through the metallic plate 50 and may be a bottomed hole. The opening shape of the positioning recessed part 54 is not particularly limited. In the present embodiment, the positioning recessed part 54 is formed in a rectangular hole shape. The opening shape of the positioning recessed part 54 may be a circular shape, oval shape, slit shape, or polygonal shape such as a triangular shape.

The positioning protruding part 62 is formed at one long-side portion of the sheet fixing member 60. One or more positioning protruding parts 62 may be provided. In the present embodiment, a plurality of (two in this example) positioning protruding parts 62 are formed spaced apart from each other along one long-side portion of the sheet fixing member 60 in correspondence with the plurality of positioning recessed parts 54. The spacing between the plurality of positioning recessed parts 54 and the spacing between the plurality of positioning protruding parts 62 are the same.

The positioning protruding part 62 is formed by partially extending one long-side portion of the sheet fixing member 60 in a belt shape and bending the extended portion toward the one main surface of the sheet fixing member 60. More specifically, a partial recess 61 is formed at one long-side portion of the sheet fixing member 60. The belt-like portion is extended from the bottom of the recess 61. The belt-like portion is bent toward the one main surface of the sheet fixing member 60 to form the positioning protruding part 62. The positioning protruding part 62 protrudes beyond the one main surface of the sheet fixing member 60.

The width dimension of the positioning protruding part 62 may be smaller than the width dimension of the recess 61. The positioning protruding part 62 may have an inward surface 62f located outside of a bottom 61a of the recess 61. In this case, when the sheet fixing member 60 is viewed from the side opposite to the metallic plate 50, a clearance 61s is formed outside of the positioning protruding part 62.

With the sheet fixing member 60 overlapped with the metallic plate 50, the positioning protruding part 62 is fitted into the positioning recessed part 54 (see arrow P2 in FIG. 3). At this time, the positioning protruding part 62 is positioned in contact with one of the peripheral edges of the positioning recessed part 54. Thus, the sheet fixing member 60 is positioned with respect to the metallic plate 50. When the plurality of protruding parts 62 are positioned in the plurality of positioning recessed parts 54, rotation of the sheet fixing member 60 relative to the metallic plate 50 is restricted.

With the sheet fixing member 60 overlapped with the metallic plate 50, one end portion of the conductive sheet 40 is sandwiched between the metallic plate 50 and the sheet fixing member 60. More specifically, one end portion of the conductive sheet 40 is sandwiched between the metallic plate 50 and the sheet fixing member 60 in a state in which the width direction of the one end portion of the conductive sheet 40 is aligned with the longitudinal direction of the sandwiching and fixing body part 52 in the metallic plate 50 and the sheet fixing member 60 (see arrow P1 in FIG. 3).

At this time, the conductive sheet 40 may be in contact with the positioning protruding parts 62. In this example, the edge of the one end portion of the conductive sheet 40 is in contact with inner portions of the plurality of positioning protruding parts 62. Accordingly, the conductive sheet 40 is sandwiched at a fixed position relative to the metallic plate 50 and the sheet fixing member 60.

Window portions (windows) that enable viewing of the edge of the conductive sheet 40 in contact with the positioning protruding parts 62 are formed in the other of the metallic plate 50 and the sheet fixing member 60 (that is, the one in which the positioning protruding parts 62 are formed) at positions next to the positioning protruding parts 62. In this example, as the window portions, the clearances 61s are formed outside the positioning protruding parts 62. It is possible to determine whether the edge of the one end portion of the conductive sheet 40 is present at a predetermined position in contact with the inner portions of the plurality of positioning protruding parts 62 by checking if the edge of the one end portion of the conductive sheet 40 is visible through the clearances 61s.

The metallic plate 50 and the sheet fixing member 60 are overlapped with and fixed to each other. In the present embodiment, the metallic plate 50 and the sheet fixing member 60 are fixed to each other by a mechanical clinch part 70 (mechanical clinch). The mechanical clinch here refers to keeping two metallic plates in an overlapped state by a mechanical fitting structure of a protruding part formed in one of the two metallic plates and a recessed part formed in the other. The mechanical clinch part 70 refers to such a fitting structure of a protruding part 72 and a recessed part 74.

In the example illustrated in FIGS. 2 and 4, the protruding part 72 is formed in the sheet fixing member 60, and the recessed part 74 is formed in the metallic plate 50. The protruding part 72 is fitted into the recessed part 74 to keep the sheet fixing member 60 in a state of being overlapped with the metallic plate 50. The recess-protrusion relationship between the sheet fixing member 60 and the metallic plate 50 may be reversed.

The mechanical clinch part 70 as described above can be formed by pressing the metallic plate 50 and the sheet fixing member 60 in an overlapped state to cause partial plastic deformation of the metallic plate 50 and the sheet fixing member 60, for example. During or after the pressing, the base end portion of the protruding part 72 and the opening portion of the recessed part 74 may be plastically deformed so as to be narrow. In this case, the leading end portion of the protruding part 72 becomes wider than the base end portion, and the base end portion of the recessed part 74 is wider than the opening portion. This makes the protruding part 72 less likely to come off the recessed part 74.

The metallic plate 50 and the sheet fixing member 60 are kept in the overlapped state by the mechanical clinch part 70. The position and number of the mechanical clinch part 70 in the overlap between the metallic plate 50 and the sheet fixing member 60 can be freely set. For example, one mechanical clinch part may be formed in the center of the sheet fixing member 60 in the longitudinal direction. Alternatively, for example, one pair of mechanical clinch parts may be formed at end portions of the sheet fixing member 60 in the longitudinal direction. In the present embodiment, a plurality of (five in this example) mechanical clinch parts 70 are formed spaced apart from each other in the longitudinal direction of the sheet fixing member 60.

In the present embodiment, the mechanical clinch parts 70 are present in an area where a portion of the conductive sheet 40 is sandwiched between the metallic plate 50 and the sheet fixing member 60. Accordingly, the conductive sheet 40 is sandwiched between the protruding part 72 and the recessed part 74 in each mechanical clinch part 70. The conductive sheet 40 is firmly sandwiched between the metallic plate 50 and the sheet fixing member 60 around the mechanical clinch parts 70. The mechanical clinch parts 70 may be provided at any positions in the arrangement area of the conductive sheet 40. For example, some or all of the mechanical clinch parts may be present outside the area where a portion of the conductive sheet 40 is sandwiched between the metallic plate 50 and the sheet fixing member 60.

The metallic plate 50 and the sheet fixing member 60 may be fixed to each other in the overlapped state via a means other than the mechanical clinch parts 70. For example, the metallic plate 50 and the sheet fixing member 60 may be fixed to each other in the overlapped state via welding, caulking, soldering, screwing, or the like.

According to the conductive sheet with a metallic plate 30 configured as above, with the positioning protruding parts 62 positioned in contact with the edges of the positioning recessed parts 54, the sheet fixing member 60 is overlapped with the metallic plate 50. Accordingly, the metallic plate 50 and the sheet fixing member 60 sandwiching the conductive sheet 40 therebetween can be easily positioned. Since one end portion of the conductive sheet 40 is sandwiched and fixed between the metallic plate 50 and the sheet fixing member 60 is correctly positioned, the conductive sheet with a metallic plate 30 can be manufactured with stable quality.

With the conductive sheet 40 in contact with the positioning protruding parts 62, the conductive sheet 40 is sandwiched between the metallic plate 50 and the sheet fixing member 60. Accordingly, the amount of sandwiching the conductive sheet 40 between the metallic plate 50 and the sheet fixing member 60 becomes stable, and thus the conductive sheet 40 is stably fixed to the metallic plate 50 and the sheet fixing member 60.

The positioning recessed parts 54 are formed as positioning holes whose peripheries are entirely surrounded by edges. Accordingly, the positioning protruding parts 62 are positioned within the positioning recessed parts 54 in every direction. This allows the sheet fixing member 60 to be more reliably positioned with respect to the metallic plate 50.

The positioning recessed parts 54 are formed in the metallic plate 50, and the positioning protruding parts 62 are formed in the sheet fixing member 60. The metallic plate 50 also has differently functioning parts such as the fixing section 56, and thus may have a shape whose front and back sides can be easily identified. On the other hand, the sheet fixing member 60 is a member dedicated to fixing the conductive sheet 40, and thus may have a simple shape. In this example, the sheet fixing member 60 has an elongated rectangular plate shape and can be observed to be evenly shaped when viewed from any side. However, when the sheet fixing member 60 is closely observed, its front and back sides may be distinguished due to the presence or absence of surface treatment on the two sides, difference in roughness, the presence or absence of burrs on the edges caused by pressing, or the like. Accordingly, when the positioning protruding parts 62 are formed in the sheet fixing member 60, the front and back sides of the sheet fixing member 60 can be distinguished using the protruding direction of the positioning protruding parts 62 as a clue.

For example, the positioning protruding parts 62 may protrude toward the side opposite to the side with burrs caused by pressing. Accordingly, the burrs become unlikely to come into contact with the conductive sheet 40 when the sheet fixing member 60 is overlapped with the metallic plate 50.

The metallic plate 50 and the sheet fixing member 60 are fixed to each other in the overlapped state by the mechanical clinch part 70. Thus, the metallic plate 50 and the sheet fixing member 60 can be easily fixed to each other by press work or the like. This achieves favorable workability of fixing as compared to the case of fixing the metallic plate and the sheet fixing member to each other by using another fixing means such as riveting or screwing.

MODIFIED EXAMPLES

Modified examples will be described. FIG. 5 is a perspective view of a conductive sheet with a metallic plate 130 according to a first modified example. The conductive sheet with a metallic plate 130 includes a conductive sheet 40, a metallic plate 150, and a sheet fixing member 160.

The metallic plate 150 is formed in an elongated rectangular shape. A positioning recessed part 154 is formed in the middle of the edge on either side of the metallic plate 150, in the extending direction. Each positioning recessed part 154 is formed so as to be partially recessed in a rectangular shape from the edge of the metallic plate 150. Each positioning recessed part 154 is shaped such that three sides of its periphery are surrounded by an edge and the remaining one side is open outward. Each positioning recessed part 154 is an example of a positioning notch that is partially surrounded by an edge. The metallic plate 150 may have a fixing section integrated therein for fixing to the fixing target part.

The sheet fixing member 160 is formed from a metallic plate in an elongated plate shape. The sheet fixing member 160 has a positioning protruding part 162 in the middle of the edge on either side in the extending direction. Each positioning protruding part 162 protrudes from the edge of the sheet fixing member 160 toward one surface of the sheet fixing member 160. In this example, each positioning protruding part 162 is formed by extending, in a belt shape, a portion of the edge on either side of the sheet fixing member 160 and bending the belt-shape portion toward one surface of the sheet fixing member 160. With each positioning protruding part 162 in contact with the three edges of the corresponding positioning recessed part 154, the sheet fixing member 160 is overlapped with the metallic plate 150. Accordingly, the sheet fixing member 160 is correctly positioned with respect to the metallic plate 150. In particular, the metallic plate 150 and the sheet fixing member 160 are positioned with respect to each other in the short-side direction of the metallic plate 150 by fitting the two positioning protruding parts 162 into the corresponding positioning recessed parts 154. In addition, the metallic plate 150 and the sheet fixing member 160 are positioned with respect to each other in the long-side direction of the metallic plate 150 by fitting the positioning protruding parts 162 into the positioning recessed parts 154 at the longitudinal ends of the metallic plate 150. In this state, the metallic plate 150 and the sheet fixing member 160 are fixed to each other by mechanical clinch parts 170 corresponding to the mechanical clinch parts 70.

An end portion of the conductive sheet 40 is sandwiched and fixed between the metallic plate 150 and the sheet fixing member 160. Check windows 150h and 160h are formed at the long-side edges of the metallic plate 150 and the sheet fixing member 160 opposite to the side from which the conductive sheet 40 extends. In this example, a plurality of check windows 150h and 160h are formed spaced apart from each other in the direction along the edges. The check windows 150h and 160h are formed so as to be recessed inward in a rectangular shape from portions of the long-side edges of the metallic plate 150 and the sheet fixing member 160. One end portion of the conductive sheet 40 is sandwiched between the metallic plate 150 and the sheet fixing member 160 such that the edge of the one end portion of the conductive sheet 40 reaches the check windows 150h and 160h. The sandwiched state of the conductive sheet 40 between the metallic plate 150 and the sheet fixing member 160 can be checked by checking if the edge of the one end portion of the conductive sheet 40 can be seen through the check windows 150h and 160h.

As in the present modified example, each positioning recessed part 154 may be a positioning notch part that is partially surrounded by an edge, another portion of the positioning notch part being open. In this case, since a portion of the periphery of the positioning recessed part 154 is open, it is easy to move the positioning protruding part 162 relative to the positioning recessed part 154 while checking the positional relationship between the positioning protruding part 162 and the positioning recessed part 154. Accordingly, the positioning protruding part 162 can be easily positioned by the positioning recessed part 154.

FIG. 6 is a perspective view of a conductive sheet with a metallic plate 230 according to a second modified example. The conductive sheet with a metallic plate 230 includes a conductive sheet 40, a metallic plate 250, and a sheet fixing member 260.

The metallic plate 250 is formed in an elongated rectangular shape. A positioning protruding part 254 is formed inside the edge on either side of the metallic plate 250. Each positioning protruding part 254 is shaped so as to protrude toward one surface of the metallic plate 250. In this example, each positioning protruding part 254 is formed by making a linear slit inside the edge on either side of the metallic plate 250 and bending and raising the portion outside the slit.

In addition, protruding parts 256 are formed inside the edge of one long side of the metallic plate 250. The protruding parts 256 are shaped so as to protrude toward one surface of the metallic plate 250. In this example, each positioning protruding part 256 is formed by making a linear slit inside the edge of the long side of the metallic plate 250 and bending and raising the portion outside the slit. In this example, two protruding parts 256 are formed spaced apart from each other inside the edge of one long side of the metallic plate 250.

The sheet fixing member 260 is formed from a metallic plate in an elongated plate shape. The long-side dimension of the sheet fixing member 260 is smaller than the long-side dimension of the metallic plate 250. The short-side dimension of the sheet fixing member 260 is also smaller than the short-side dimension of the metallic plate 250.

Positioning recessed parts 262 are formed in the middle of the edges on both sides of the sheet fixing member 260. Each positioning recessed part 262 is formed so as to be partially recessed from the edge in a rectangular shape. Each positioning recessed part 262 is an example of a positioning notch part that is partially surrounded by an edge, another portion of the positioning notch part being open. Recessed parts 264 are formed at the edge of one long side of the sheet fixing member 260, at positions corresponding to the protruding parts 256. Each recessed part 264 is formed so as to be partially recessed from the edge in a rectangular shape.

With each positioning protruding part 254 in contact with the three edges of the corresponding positioning recessed part 262, the sheet fixing member 260 is overlapped with the metallic plate 250. Accordingly, as in the first modified example, the sheet fixing member 260 is correctly positioned with respect to the metallic plate 250. In this state, the metallic plate 250 and the sheet fixing member 260 are fixed to each other by mechanical clinch parts 270 corresponding to the mechanical clinch parts 70.

An edge portion of the conductive sheet 40 is sandwiched and fixed between the metallic plate 250 and the sheet fixing member 260. With the metallic plate 250 and the sheet fixing member 260 overlapped with each other, each protruding part 256 is arranged in the corresponding recessed part 264, at a position separated from the bottom of the recessed part 264. One end portion of the conductive sheet 40 is sandwiched between the metallic plate 250 and the sheet fixing member 260 such that the edge of the one end portion of the conductive sheet 40 is in contact with the protruding parts 256. Accordingly, the conductive sheet 40 can be sandwiched between the metallic plate 250 and the sheet fixing member 260, using the protruding parts 256 as parts for positioning the conductive sheet 40. This stabilizes the sandwiched state of the conductive sheet 40 between the metallic plate 250 and the sheet fixing member 260. In addition, when the edge of the one end portion of the conductive sheet 40 is in contact with the protruding parts 256, the edge of the one end portion of the conductive sheet 40 can be visually checked between the bottom of the recessed parts 264 and the protruding parts 256. Accordingly, it is possible to determine whether the end portion of the conductive sheet 40 is sandwiched at a predetermined position by checking whether or not the edge of the one end portion of the conductive sheet 40 is between the bottom of the recessed parts 264 and the protruding parts 256.

Both side portions of each protruding part 256 are in contact with both side edges of the corresponding recessed part 264. In this respect, the protruding parts 256 may be considered as an example of positioning protruding parts, and the recessed parts 264 may be considered as an example of positioning recessed parts.

Also in the second modified example, the periphery of each positioning recessed part 262 is partially open, and therefore each positioning protruding part 254 can be easily moved toward the corresponding positioning recessed part 262 while checking the positional relationship between the positioning protruding part 254 and the positioning recessed part 262. Accordingly, the positioning protruding parts 254 can be readily positioned by the positioning recessed parts 262.

The attachment structure of the other end portion of the conductive sheet 40 and the metallic cover 26 may be the same as or different from the structures in the embodiment or modified examples described above. As a different structure, for example, the other end portion of the conductive sheet 40 may be fixed to the metallic cover 26 by soldering, welding, caulking, or the like.

The conductive sheets with a metallic plate 30, 130, and 230 may be electromagnetic shield members or other members. As other members, for example, if a bracket 310 is fixed to the casing 11 of the first electric device 10 and a bracket 320 is fixed to the casing 15 of the second electric device 14 in the configuration of FIG. 1, the end portions of a conductive sheet 340 may be fixed to the brackets 310 and 320. In this case, a conductive sheet with a metallic plate 330 is assumed to be a member used as a grounding current path for electrically connecting the casing 11 that is an example of a part to be grounded and the casing 15 that is an example of a part to be grounded.

The metallic plates 50, 150, and 250 may or may not have a fixing part such as the fixing section 56. The metallic plates 50, 150, and 250 may have a part other than a fixing part, for example, a part that is to be an electromagnetic shield case.

The components in the embodiment and modified examples described above can be combined as appropriate as long as there are no inconsistencies therebetween.

The invention claimed is:

1. An electromagnetic shielding conductive assembly comprising:
   a conductive sheet that comprises a metallic braid, a metallic cloth, or a metallic net;
   a metallic plate; and
   a sheet fixing plate separate from the metallic plate, the sheet fixing plate including a first long side and a second long side opposite to the first long side, wherein:
      a portion of the conductive sheet is sandwiched between the metallic plate and the sheet fixing plate,
      the sheet fixing plate is overlapped with and fixed to the metallic plate,
      a positioning recess is formed in one of the metallic plate and the sheet fixing plate, and a positioning protrusion is formed in the other so as to be positioned in contact with an edge of the positioning recess,
      the conductive sheet extends beyond the first long side,
      an edge of the conductive sheet is between the first long side and the second long side, and
      a window is formed in at least one of the metallic plate and the sheet fixing plate, the window enabling viewing of the edge of the conductive sheet.

2. The electromagnetic shielding conductive assembly according to claim 1, wherein the conductive sheet is in contact with the positioning protrusion.

3. The electromagnetic shielding conductive assembly according to claim 1, wherein:
   the positioning recess includes a positioning hole with a periphery that is entirely surrounded by an edge, and
   the positioning protrusion is fitted in the positioning hole.

4. The electromagnetic shielding conductive assembly according to claim 1, wherein:
   the positioning recess includes a positioning notch that is partially surrounded by an edge, and
   the positioning protrusion is in contact with an edge of the positioning notch.

5. The electromagnetic shielding conductive assembly according to claim 1, wherein the positioning recess is formed in the metallic plate, and the positioning protrusion is formed in the sheet fixing plate.

6. The electromagnetic shielding conductive assembly according to claim 1, wherein:
   the sheet fixing plate is a plate made of a metal, and
   the metallic plate and the sheet fixing plate are fixed to each other by a mechanical clinch.

\* \* \* \* \*